(12) United States Patent
Petitgrand

(10) Patent No.: US 10,684,233 B2
(45) Date of Patent: Jun. 16, 2020

(54) POSITIONING DEVICE FOR AN INTEGRATED CIRCUIT BOARD, AND INSPECTION APPARATUS FOR AN INTEGRATED CIRCUIT BOARD COMPRISING SUCH A POSITIONING DEVICE

(71) Applicant: UNITY SEMICONDUCTOR, Montbonnot-Saint-Martin (FR)

(72) Inventor: Sylvain Petitgrand, Caissargues (FR)

(73) Assignee: UNITY SEMICONDUCTOR, Montbonnot-Saint-Martin (FR)

( * ) Notice: Subject to any disclaimer, the term of this patent is extended or adjusted under 35 U.S.C. 154(b) by 0 days.

(21) Appl. No.: 16/319,455

(22) PCT Filed: Jun. 1, 2017

(86) PCT No.: PCT/EP2017/063352
§ 371 (c)(1),
(2) Date: Jan. 21, 2019

(87) PCT Pub. No.: WO2017/215941
PCT Pub. Date: Dec. 21, 2017

(65) Prior Publication Data
US 2019/0219520 A1    Jul. 18, 2019

(30) Foreign Application Priority Data

Jun. 17, 2016  (FR) ...................................... 16 55670

(51) Int. Cl.
*G01B 11/00*        (2006.01)
*G01N 21/95*        (2006.01)
(Continued)

(52) U.S. Cl.
CPC ...... *G01N 21/9501* (2013.01); *G01B 11/0608* (2013.01); *G01R 31/2891* (2013.01); *H01L 21/67346* (2013.01)

(58) Field of Classification Search
CPC ............ G01B 11/0608; G01N 21/9501; G01R 31/2891; H01L 21/67346
(Continued)

(56) References Cited

U.S. PATENT DOCUMENTS 5,901,829 A    5/1999  Ito
6,183,189 B1   2/2001  Lzu et al.
(Continued)

OTHER PUBLICATIONS

French Search Report from French Patent Application No. 1655670, dated Jan. 31, 2017.
(Continued)

*Primary Examiner* — Sunghee Y Gray
(74) *Attorney, Agent, or Firm* — Greer, Burns & Crain, Ltd.

(57) ABSTRACT

A device for positioning an integrated circuit wafer includes: a base, called upper, and a base, called lower, arranged at a distance from one another in a direction, called vertical, so as to leave a free space between the bases; a support, provided to be mobile between the upper and lower bases, and including a location for receiving the wafer to be inspected; at least one first means apparatus for positioning the support in the vertical direction against, or by cooperation with, the upper base; and at least one second means apparatus for positioning the support in the vertical direction against, or by cooperation with, the lower base.
Also provided is an inspection equipment for an integrated circuit wafer implementing such a positioning device.

14 Claims, 3 Drawing Sheets

(51) Int. Cl.
*H01L 21/673* (2006.01)
*G01R 31/28* (2006.01)
*G01B 11/06* (2006.01)

(58) Field of Classification Search
USPC .................................. 356/394–401
See application file for complete search history.

(56) References Cited

U.S. PATENT DOCUMENTS

| | | | |
|---|---|---|---|
| 6,286,202 B1* | 9/2001 | Asai | H05K 13/0815 |
| | | | 29/740 |
| 9,958,261 B2* | 5/2018 | Fresquet | G01B 9/0203 |
| 2002/0005166 A1 | 1/2002 | Kisaichi | |
| 2002/0104229 A1 | 8/2002 | Shin et al. | |
| 2005/0045821 A1* | 3/2005 | Noji | G01N 23/225 |
| | | | 250/311 |
| 2007/0139642 A1 | 6/2007 | Ikeda et al. | |
| 2018/0275192 A1* | 9/2018 | Yamada | H01L 21/68 |

OTHER PUBLICATIONS

International Search Report from International Patent Application No. PCT/EP2017/063352, dated Sep. 21, 2017.

* cited by examiner

POSITIONING DEVICE FOR AN INTEGRATED CIRCUIT BOARD, AND INSPECTION APPARATUS FOR AN INTEGRATED CIRCUIT BOARD COMPRISING SUCH A POSITIONING DEVICE

BACKGROUND

The present invention relates to a device for positioning an integrated circuit wafer, in particular with a view to the inspection of said integrated circuit wafer in an inspection equipment. It also relates to an equipment for inspecting an integrated circuit wafer, such as for example an optical profilometry equipment, comprising such a device.

The field of the invention is more particularly, but non-limitatively, that of inspection equipment for the microelectronics and integrated optics industry.

Electronic or optical integrated circuits are generally produced in the form of integrated circuit wafers.

An integrated circuit wafer can comprise a wafer, which is a slice or wafer of semi-conductor and/or dielectric material on the surface of which patterns and elements of integrated circuits are produced, in particular by deposition or etching operations.

An integrated circuit wafer can also comprise, according to the manufacturing steps, for example,

- wafer elements, or cut wafer parts, arranged on a support such as another wafer or a film:
- integrated circuit stacks produced beforehand; or
- composite structures with integrated circuits and connecting elements in a common matrix.

During the manufacturing steps, it is often necessary to inspect one or more surfaces of the integrated circuit wafer with a view for example to characterizing or validating the patterns produced on said surface, monitoring the thickness of the wafer, etc. In particular, it may be necessary to determine if trenches or marks produced on one face of the wafer have the desired characteristics, in terms of depth or in terms of height. Such an inspection can for example be carried out by an optical profilometry device. It may also be necessary to inspect the surface of a wafer for other reasons with other types of device.

Taking account of the very small dimensions of the patterns present on the surface of a wafer, it is necessary to position the wafer very precisely, and very near to the sensor or sensors used for the inspection. In addition, when it is desired to inspect different zones of the surface area, or even the entire surface area of the wafer, it is also necessary to move the wafer quickly with respect to the sensors.

Now, the devices for positioning integrated circuit wafers currently in use do not allow these requirements to be met.

A purpose of the invention is to overcome this drawback.

Another purpose of the present invention is to propose a device for positioning an integrated circuit wafer having a simple architecture and allowing rapid and accurate positioning of said wafer.

Yet another purpose of the present invention is to propose a wafer positioning device having a simple architecture while allowing simultaneous inspection of both faces of the wafer.

SUMMARY

At least one of these objectives is achieved with a device for positioning an integrated circuit wafer, comprising:

- a base, called upper, and a base, called lower, arranged at a distance from one another in a direction, called vertical, so as to leave a free space between said bases;
- a support, provided to be mobile between said upper and lower bases, and comprising a location for receiving said wafer to be inspected;
- at least one first means for positioning said support in said vertical direction against, or by cooperation with, said upper base; and
- at least one second means for positioning said support in said vertical direction against, or by cooperation with, said lower base.

Thus, the device according to the invention comprises two bases, each used as a positioning reference for positioning the integrated circuit wafer in the vertical direction. These two bases are offset such that the wafer is located between said bases during its inspection. Thus, the wafer is positioned in both directions along the vertical direction, which allows more accurate and quicker positioning.

In addition, during its inspection, the wafer is located between the upper base and the lower base. As a result, by equipping each base with a sensor directed towards the other base, it is possible to carry out a simultaneous inspection of both faces of the wafer. It is also possible to carry out measurements of the thickness of the wafer or transmission measurements from one face to the other of the wafer.

Hereinafter, the term "inspection" can denote all operations of measurement, visualization, imaging, etc. carried out by optical, electric (capacitive, inductive, etc.) or acoustic means, such as for example:

- measurements of thickness, height or depth on patterns or layers of the wafer,
- measurements of dimensions (of patterns, structures, zones, etc.) in the plane of the wafer,
- visualizations of surface condition, presence or absence of elements or patterns,
- locations of elements or patterns, and
- detection of defects or particles.

Hereinafter, the "lower face" of the upper base is the face of the upper base located on the side of the mobile support and of the lower base; the "upper face" of the lower base is the face of the lower base located on the side of the support and of the upper base.

In the present application, the expressions "vertical direction" or "horizontal direction" are used to avoid editorial burdens and do not imply absolute orientation in space. At most, a vertical direction is a direction perpendicular to the plane of the wafer and a horizontal direction is a direction parallel to the plane formed by the wafer.

The lower face of the upper base can be parallel to the upper face of the lower base.

Preferentially, the vertical direction is the direction of inspection of the wafer.

In particular, the vertical direction can be perpendicular to the plane formed by the wafer when it is arranged in the receiving location, and/or to the lower face of the upper base, and/or to the upper face of the lower base.

At least one, in particular each, base can be provided in order to receive, or can be equipped with, at least one sensor for inspecting a face of the wafer.

In particular, the upper base can be provided in order to receive, or can be equipped with, a measuring head comprising one or more sensors used in turn or simultaneously. Such a measuring head equipping the upper base is called "upper measuring head" hereinafter.

Similarly, the lower base can be provided in order to receive, or be equipped with, a measuring head comprising one or more sensors used in turn or simultaneously. Such a measuring head equipping the lower base is called "lower measuring head" hereinafter.

In an embodiment, the upper and lower measuring heads can be aligned opposite one another, in particular in the plane of the wafer.

In a preferred version of the device according to the invention, the upper and lower bases can also be offset with respect to one another in another direction, called horizontal direction, perpendicular to the vertical direction.

This horizontal direction can preferentially be a direction of introduction of the wafer between said bases.

In particular, the horizontal direction can be parallel to the plane formed by the wafer when it is arranged in the receiving location, and/or to the lower face of the upper base, and/or to the upper face of the lower base.

In particular, the bases can be located at a distance from one another in said horizontal direction such that there is a free space between said bases in said horizontal direction.

Advantageously, in this version:
the upper measuring head can be arranged at an edge of said upper base proximal to the lower base; and/or
the lower measuring head can be arranged at an edge of said lower base proximal to the upper base.

Such a positioning of the measuring head or heads allows a simple architecture while offering the possibility of inspecting both faces of the wafer simultaneously. In fact, such a positioning makes it possible to inspect both faces of the wafer simultaneously, while avoiding the need to provide a through hole in either one of the upper and lower bases.

According to an advantageous feature, the distance between the bases, in said horizontal direction, can be adjusted such that the measuring heads are aligned opposite one another, in said horizontal direction, and more particularly in the plane of the wafer.

Preferentially, the lower and upper bases can be linked together so as to form a single-piece unit.

According to an embodiment, the upper and lower bases can be linked together by two connecting arms, at two opposite edges of each one of said bases.

Each connecting arm can extend in the horizontal direction between the lower base and the upper base.

In particular, the connecting arms can be parallel to one another.

The single-piece assembly, formed by the upper and lower bases, and optionally the connecting arms, can be obtained by machining from a single piece.

Alternatively, the single-piece assembly can be formed by several parts manufactured individually and assembled together, for example by bonding or by screwing.

At least one of the upper and lower bases can be produced from granite or marble.

Alternatively, or in addition, at least one of the upper and lower bases can be produced from a metallic material, or from a material sensitive to magnetic force.

The upper face of the lower base, respectively the lower face of the upper base, can be rectified in order to offer greater flatness or regularity.

Advantageously, the at least one first, respectively the at least one second, positioning means can comprise at least one means of adhesion to, or holding together with, the upper face, respectively the lower face, in the vertical direction, free in translational motion in at least one, in particular all, the direction(s) perpendicular to said vertical direction.

Preferentially, such a means of adhesion (or holding) in free translational motion can be a means producing contactless adhesion (or holding) with the base. Such a contactless adhesion (or holding) means has zero friction with the base, and therefore a more accurate and quicker positioning, while still consuming less energy.

According to a particularly advantageous version, at least one means of adhesion (or holding) in free translational motion can comprise a vacuum air bearing.

According to an alternative, at least one means of adhesion (or holding) in free translational motion can comprise a vacuum air bearing associated with an anti-friction bearing abutting against the base.

According to another alternative, when a base comprises a material sensitive to magnetic attraction, at least one means of adhesion (or holding) in free translational motion to said base can comprise a vacuum air bearing.

Of course, these examples are non-limitative and other adhesion means in free translational motion can be used.

Advantageously, the first and second positioning means can be arranged secured to the support, on each side of the receiving location in a horizontal direction, perpendicular to the vertical direction.

Thus, the accuracy of positioning and the stability of the wafer support, and thus the wafer, are improved.

When the bases are offset with respect to one another in a horizontal direction, which may be the direction of introduction of the wafer between the bases, the first and second positioning means can be arranged secured to the support, on each side of the receiving location in said horizontal direction.

Preferentially, the first and second positioning means can be arranged on two opposite faces of the support, thus even further improving the positioning obtained.

Moreover, the at least one first, respectively the at least one second, positioning means can advantageously comprise several positioning means.

In this case, at least two first, respectively two second, positioning means can advantageously be arranged on each side of the receiving location in a horizontal direction perpendicular to the vertical direction. Thus, the accuracy of positioning and the stability of the wafer support, and thus the wafer, are improved.

This horizontal direction is preferentially perpendicular to the horizontal direction in which the bases are offset with respect to one another, when this is the case.

Preferably, the receiving location can be at least partially perforated, so as to allow access to the wafer which is arranged therein, on the side of each base.

Thus, it is possible to gain access, in particular simultaneously, to one of the faces of the wafer from one of the bases and to the opposite face of the wafer from the other base. It is then possible to inspect both faces of the wafer at the same time.

The device according to the invention can advantageously comprise a displacement module, in particular motorized, of the support with respect to the bases, producing a translation of said support in a first and a second horizontal directions, perpendicular to one another and to the vertical direction.

One of the horizontal directions may be the direction of introduction of the wafer between the bases.

According to an embodiment, the support can be fixed to the displacement module by means of a first and a second sliding links in said first horizontal direction, substantially parallel to one another, and arranged on each side of the support.

According to an embodiment, the first sliding link can be rigid, and the second sliding link can be flexible.

Use of a rigid link associated with a flexible link makes it possible to carry out accurate positioning, while absorbing, via the flexible link, defects of parallelism of said sliding links.

The rigid sliding link can be provided by a first slide to which the support can be fixed directly or indirectly.

The flexible sliding link can be provided by a second slide combined with a spring blade.

Preferably, this first horizontal direction can be the horizontal direction in which the bases are offset with respect to one another, when this is the case.

Advantageously, the support can be fixed to the displacement module by means of a sliding link in the second horizontal direction.

According to an embodiment, this sliding link can be flexible, at least in the directions other than the second horizontal direction.

The flexibility of this sliding link makes it possible to absorb defects of flatness or parallelism of the bases, and in particular of the lower face of the upper base and of the upper face of the lower base.

This sliding link can be provided by a third slide combined with a spring blade.

Preferably, the support can be fixed to the displacement module along one of its slices, or one of its edges, only.

Thus, the other edges/slices of the support are free. In other words, the fastening points of the support with the displacement module are minimized. As a result, the positioning of the support with respect to each of its bases is carried out with greater precision and fewer constraints.

According to a non-limitative embodiment, the support can be fixed to the third slide by one of its edges, via a spring blade. The third slide can be fixed:

at one of its ends, to the first slide; and
at the other of its ends, to the second slide via a spring blade.

The displacement module can advantageously be secured to one of the bases, and/or with at least one of the connecting arms.

For example, the displacement module can be fixed to the lower face of the upper base or to the upper face of the lower base, for example via the first and second slides.

Alternatively, the displacement module can be fixed to a frame, for example of an inspection equipment, on which the device according to the invention is also arranged.

According to another aspect of the invention, an inspection equipment, in particular optical, for an integrated circuit wafer is proposed, comprising a positioning device according to the invention.

At least one, in particular each, base of the positioning device can be equipped with an optical head, in particular removable or dismountable, comprising at least one sensor.

The inspection equipment can be an equipment for characterizing the integrated circuit wafer, and more particularly an equipment for measuring at least one physical parameter relating to the integrated circuit wafer, or at least to one pattern present on a face of said integrated circuit wafer.

The inspection equipment can comprise for example:
an optical interferometer equipment,
an equipment for imaging the integrated circuit wafer; or
an apparatus for measuring the thickness of the integrated circuit wafer.

In addition, the inspection equipment can carry out an inspection of a face of an integrated circuit wafer, or a simultaneous inspection of both faces of said wafer.

BRIEF DESCRIPTION OF THE DRAWINGS

Other advantages and characteristics will become apparent on examination of the detailed description of examples which are in no way limitative, and the attached drawings, in which.

DETAILED DESCRIPTION

It is well understood that the embodiments that will be described hereinafter are in no way limitative. Variants of the invention can be envisaged comprising only a selection of characteristics described hereinafter in isolation from the other characteristics described, if this selection of characteristics is sufficient to confer a technical advantage or to differentiate the invention with respect to the state of the prior art. This selection comprises at least one, preferably functional, characteristic without structural details, or with only a part of the structural details if this part alone is sufficient to confer a technical advantage or to differentiate the invention with respect to the state of the prior art.

In particular, all the variants and all the embodiments described can be combined together if there is no objection to this combination from a technical point of view.

In the figures, elements common to several figures retain the same reference.

The embodiments described with reference to the figures describe positioning devices intended to position wafers, it being well understood that such devices can be utilized for positioning all types of integrated circuit wafers.

Figure 1:
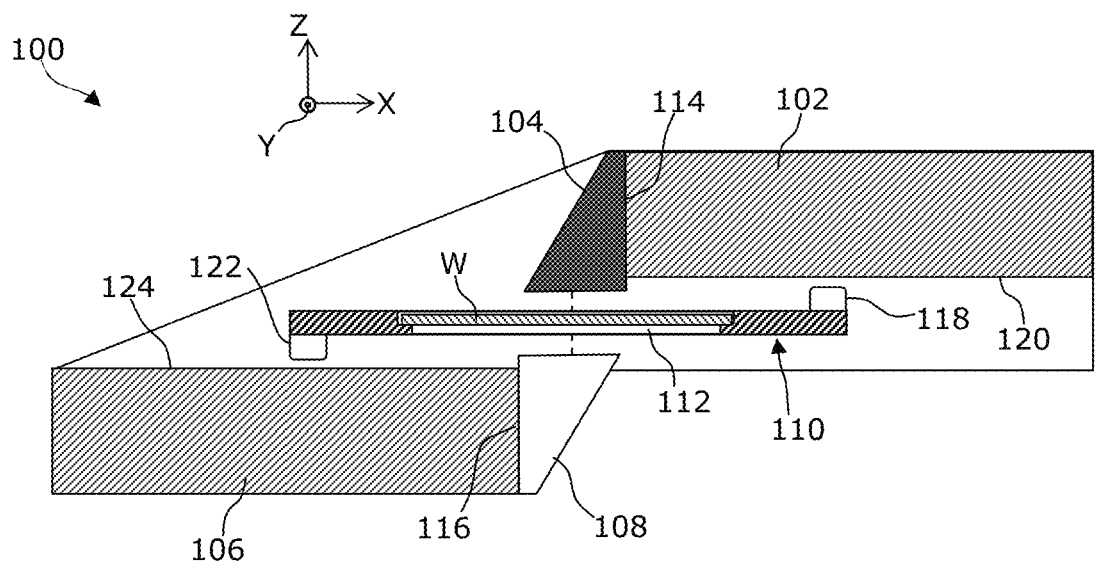
FIG. 1 is a diagrammatic representation in cross section of a non-limitative embodiment of the principle of a device according to the invention.

FIG. 1 is a diagrammatic representation in cross section of a non-limitative embodiment of the principle of a positioning device according to the invention.

The device 100, shown in FIG. 1, comprises a base 102, called upper, equipped with a measuring head 104, called upper, comprising at least one sensor, in particular optical.

The device 100 also comprises a base 106, called lower, equipped with a measuring head 108, called lower, comprising at least one sensor, in particular optical.

The positioning device 100 also comprises a support 110 comprising a perforated receiving housing 112, provided in order to receive a wafer W (or any other type of integrated circuit wafer W) to be inspected by means of the measuring heads 104 and 108.

As shown in FIG. 1, the upper 102 and lower 106 bases are offset with respect to one another in a direction, called vertical, referenced "Z" in FIG. 1, perpendicular to the plane formed by the support 110. In particular, the bases 102 and 106 can be located at a distance from one another in the direction Z such that there is a free space between said bases 102 and 106. Thus, the wafer support 110 can be inserted between the bases 102 and 106, in particular in a horizontal direction, referenced "X" in FIG. 1, perpendicular to the vertical direction Z and parallel to the plane formed by the wafer support 110.

The vertical direction Z is the direction of inspection of a wafer W arranged in the receiving housing 112 of the support 110.

Still in the non-limitative example shown in FIG. 1, the upper 102 and lower 106 bases are offset with respect to one another in the horizontal direction X. In particular, the bases 102 and 106 are located at a distance from one another in the direction X such that there is a free space between said bases 102 and 106.

The upper measuring head 104 is arranged on the upper base 102 on the side of an edge 114 of the upper base 102 proximal to the lower base 106, and is directed towards the support 110 located between the bases 102 and 106, in the vertical direction Z. Similarly, the lower measuring head 108 is arranged on the lower base 106 on the side of an edge 116 of the lower base 106 proximal to the upper base 102, and is directed towards the support 110 located between the bases 102 and 106.

Preferentially, the distance between the bases 102 and 106 is chosen such that the measuring heads 104 and 108 are aligned in the horizontal direction X. In addition, the measuring heads 104 and 108 can also be aligned in a horizontal direction, referenced Y, perpendicular to the directions X and Z, and parallel to the plane formed by the wafer support 110. Thus, the measuring heads 104 and 108 are aligned in the plane perpendicular to the vertical direction Z, comprising the horizontal directions X and Y, which correspond to the plane of the wafer W.

The support 110 is also equipped with one or more first means 118 for positioning the support 110 with reference to the upper base 102. In particular, the first positioning means 118 produce(s) a positioning of the support 110 with reference to the face 120, called lower, of the upper base 102 located on the side of the support 110.

The support 110 is also equipped with one or more second means 122 for positioning the support 110 with reference to the lower base 106. In particular, the second positioning means 118 produce(s) a positioning of the support 110 with reference to the face 124, called upper, of the lower base 106 located on the side of the support 110.

According to a preferred embodiment, each positioning means 118, respectively 120, performs remote holding (or adhesion), in free translational motion, of said support 110 with the face 120, respectively the face 124.

As shown in FIG. 1, the at least one first positioning means 118 and the at least one second positioning means are located on each side of the receiving housing 112, and therefore of the wafer W,
in the horizontal direction X. Thus, the positioning obtained is more stable and more precise.

Of course, the device 100 also comprises a module/platform for the displacement of the support between the bases 102 and 106, not shown in FIG. 1. A non-limitative embodiment of such a displacement module/platform is given in FIGS. 4a-4b, described below.

Each base can be produced from marble or granite, or also from a material sensitive to magnetic force.

Preferentially the lower face 120 of the upper base 102, respectively the upper face 124 of the lower base 106 can be rectified in order to reduce defects of flatness to the maximum.

In the example shown in FIG. 1, each of the bases 102 and 106 is equipped with a measuring head, respectively 104 and 108. Alternatively, only one of the bases may be equipped with a measuring head.

Figure 2:
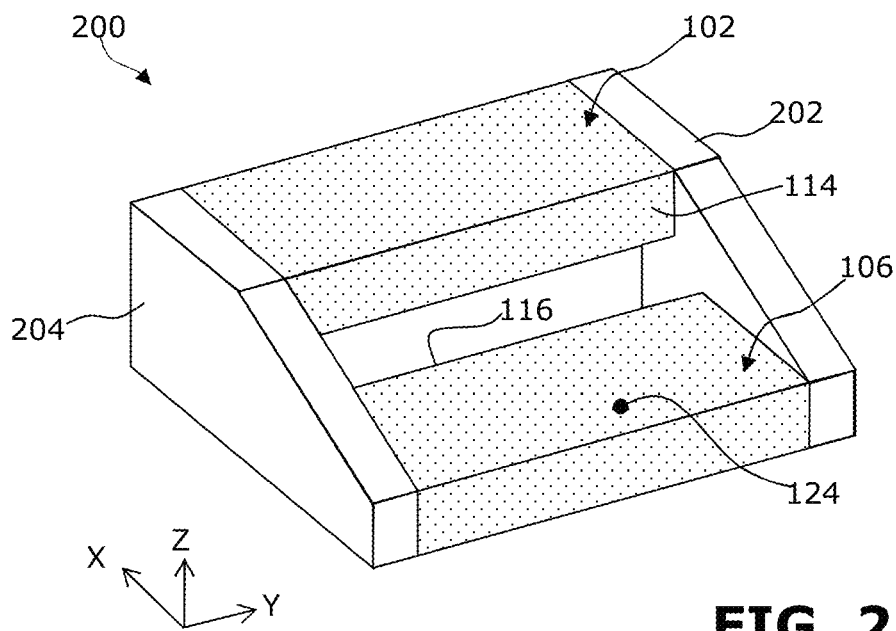
FIG. 2 is a diagrammatic representation in an isometric view of a non-limitative embodiment of upper and lower bases capable of use in a device according to the invention.

FIG. 2 is a diagrammatic representation in an isometric view of a non-limitative embodiment of upper and lower bases.

In FIG. 2, only the bases 102 and 106 are shown. The wafer support as well as the measuring heads are not shown.

As shown in FIG. 2, the bases 102 and 106 are linked together so as to form a single-piece assembly 200.

In the example shown in FIG. 2, the bases 102 and 106 are linked together by two connecting arms 202 and 204 extending in the direction X between the upper base 102 and the lower base 106. Each connecting arm 202 and 204 produces a link between an edge of the lower base 106 and an edge of the upper base 102, in the direction X.

The single-piece assembly 200, shown in FIG. 2, can be obtained by assembling, for example by bonding, several parts produced independently.

Alternatively, the single-piece assembly 200, shown in FIG. 2, can be obtained by machining a single piece such as a block of marble or granite.

Figure 3:
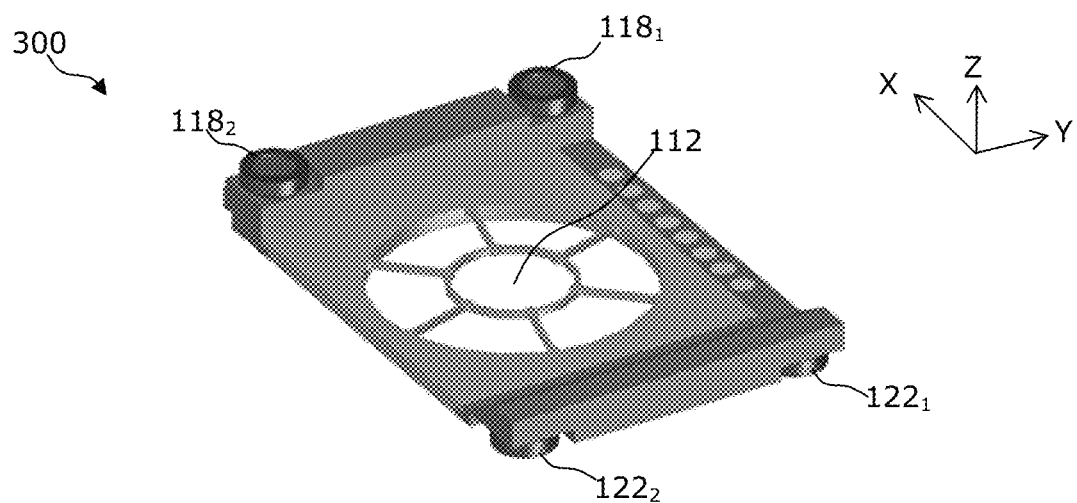
FIG. 3 is a diagrammatic representation in an isometric view of a non-limitative embodiment of a wafer support capable of use in a device according to the invention.

FIG. 3 is a diagrammatic representation in an isometric view of a non-limitative embodiment of a wafer support capable of use in a positioning device according to the invention;

The wafer support 300, shown in FIG. 3, can for example be the wafer support 110 in FIG. 1.

The wafer support 300 comprises two first positioning means $118_1$ and $118_2$, arranged on each side of the receiving location 112 in the horizontal direction Y. Each first positioning means $118_1$-$118_2$ is a vacuum air bearing producing an adhesion at the lower face 120 of the upper base 102 in both orientations of the direction Z, while remaining at a distance from said face 120.

The wafer support 300 comprises two second positioning means $122_1$ and $122_2$, arranged on each side of the receiving location 112 in the horizontal direction Y. Each second positioning means $122_1$-$122_2$ is a vacuum air bearing producing an adhesion at the upper face 124 of the lower base 106 in both orientations of the direction Z, while remaining at a distance from said face 124.

The positioning means $118_1$-$118_2$ are arranged on a support face 300 opposite to that on which the positioning means $122_1$-$122_2$ are arranged.

Alternatively, each positioning means $118_1$-$118_2$, respectively $122_1$-$122_2$, can comprise:
- a vacuum air bearing combined with an anti-friction bearing coming into contact with the face 120, respectively 124;
- a magnet, or an electromagnet, combined with an anti-friction bearing coming into contact with the face 120, respectively 124; or
- a magnet, or an electromagnet, combined with an air bearing.

The support 300 can be produced from aluminium, metal or plastic.

Figure 4A:
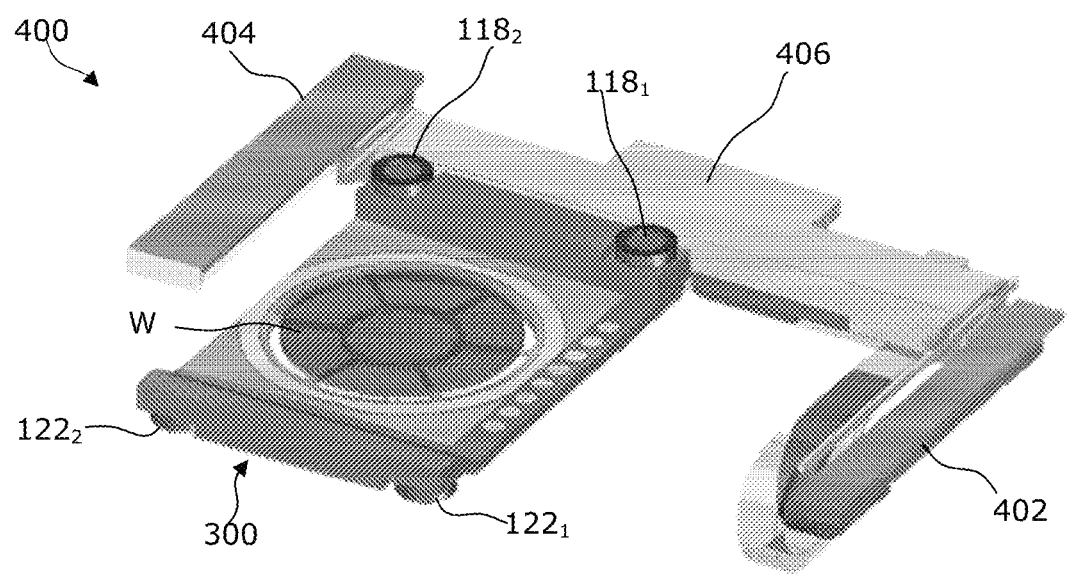
FIGS. 4a and 4b are diagrammatic representations in different views of a non-limitative embodiment of a displacement module of a wafer support capable of use in a device according to the invention.
Figure 4B:
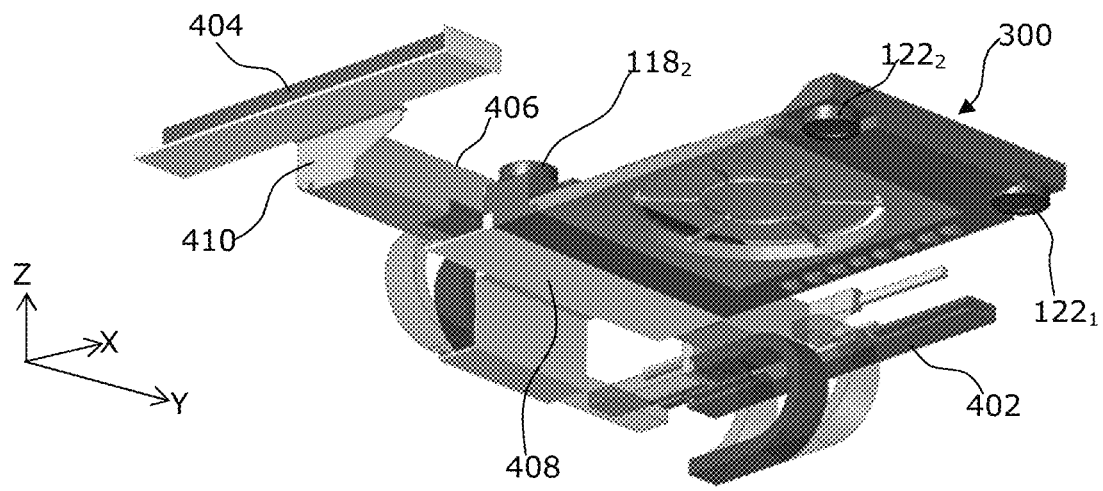

FIGS. 4a-4b are diagrammatic representations of a non-limitative embodiment of a displacement module of the wafer support,
capable of use in a positioning device according to the invention.

FIG. 4a is a representation of the displacement module 400, with the wafer support 300 of FIG. 3, in an isometric top view. FIG. 4b is a representation of the displacement module 400, with the wafer support 300 of FIG. 3, in an isometric bottom view.

The displacement module 400 comprises a first and a second slide, parallel to one another, and extending in the horizontal direction X, and a third slide 406 extending in the horizontal direction Y.

The wafer support 300 is slidably linked, in the direction Y, to the third slide 406, by one of its edges, for example the edge located on the side of the first positioning means $118_1$-$118_2$. As can be seen in FIG. 4b, the support 300 is fixed to the slide 406 via a spring blade 408, allowing said support 300 to flex around and along the direction Y so as to absorb the imperfections in the flatness of the faces 120 and 124.

A micrometric precision motor (not shown) allows the support 300 to be displaced along the slide 406, in the direction Y.

The third slide 406 is fixed:
  at one of its ends, to the first slide 402; and
  at its opposite end, to the second slide 404 via a spring blade 410, shown in FIG. 4b, allowing the defects of parallelism of the slides 402 and 404 to be absorbed.

A micrometric precision motor (not shown), for example arranged on the side of the first slide 402, allows the third slide 406 and support 300 assembly to be moved along the slides 402 and 404, in the direction X.

Figure 5:
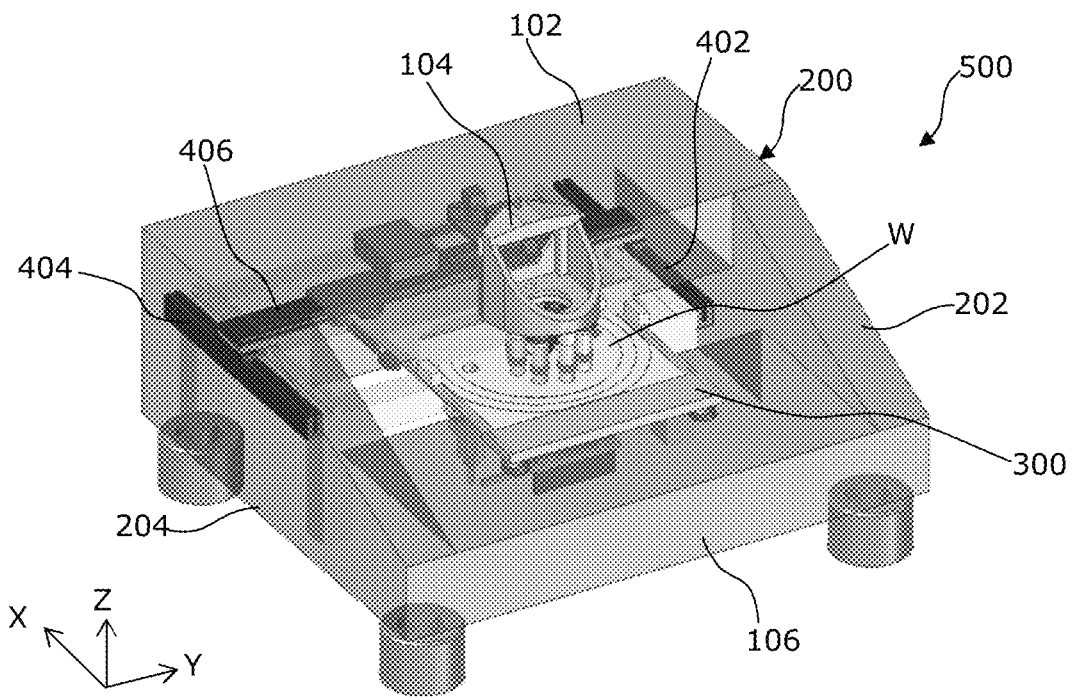
FIG. 5 is a diagrammatic representation of a non-limitative embodiment of a device according to the invention.

FIG. 5 is a diagrammatic representation, in an isometric view, of a non-limitative embodiment of a device according to the invention.

The device 500 shown in FIG. 5 comprises the single-piece assembly 200 of FIG. 2, the support 300 of FIG. 3 and the displacement module 400 of FIG. 4.

In the example shown in FIG. 5, the device 500 comprises an upper measuring head 104 only, and does not comprise a lower measuring head.

In the example shown, the displacement module 400 is rigidly fixed on the inner faces of the arms 202 and 204 linking the upper 102 and lower 106 bases, below the upper base 102.

The upper 104 and/or lower 105 measuring head or heads can comprise optical elements (such as for example lenses or objectives) making it possible to produce one or more optical paths for measuring and/or inspection.

According to the embodiments, these optical paths can be superimposed (with common optical elements) in order to be capable of being used simultaneously, and/or separately.

The upper 104 and/or lower 105 measuring heads can thus in particular comprise mechanical elements such as a lens turret (as illustrated in FIG. 5) making it possible to change the optical elements used.

The positioning device according to the invention can be utilized in any device for the inspection of a wafer, and more generally an integrated circuit wafer, comprising for example:
  an optical interferometric profilometer making it possible to carry out full-field measurements of shapes or thickness on one or both faces of a wafer (or an integrated circuit wafer);
  a low coherence interferometer with detection in the spectral or temporal domain making it possible to carry out measurements of distances, height or thickness with a measurement beam in visible or infrared wavelengths;
  a measuring device of the confocal, or chromatic confocal, type;
  a device for measuring deformation or distances by deflectometry, by structured light projection or by triangulation;
  a device for imaging a face, or faces, of a wafer (or integrated circuit wafer);
  a device for monitoring the thickness of a wafer (an integrated circuit wafer); or
  a device for detecting defects by measuring scattered light.

Of course, the invention is not limited to the examples which have just been described and numerous adjustments can be made to these examples without extending the scope of the invention.

The invention claimed is:

1. A device for positioning an integrated circuit wafer (W), comprising:
    an upper base and a lower base, arranged at a distance from one another in a vertical direction (Z), so as to leave a free space between said bases;
    a support, provided to be mobile between said upper and lower bases, and comprising a location for receiving said wafer (W) to be inspected;
    at least one first positioning means of said support in said vertical direction (Z) against, or by cooperation with, said upper base;
    at least one second positioning means of said support in said vertical direction (Z) against, or by cooperation with, said lower base; and
    the at least one first, positioning means comprises at least one means of adhesion to the upper base, and the at least one second positioning means comprises means of adhesion to the lower base, in the vertical direction (Z), free in translation in at least one direction perpendicular to said vertical direction (Z).

2. The device according to claim 1, characterized in that the upper and lower bases are offset with respect to one another in another direction (X), called horizontal, perpendicular to the vertical direction (Z).

3. The device according to claim 1, characterized in that the upper and lower bases are linked together so as to form a single-piece assembly.

4. The device according to claim 1, characterized in that at least one base is configured for receiving at least one sensor for inspecting a face of the wafer (W).

5. The device according to claim 1, characterized in that at least one adhesion means free in translation comprises a vacuum air bearing.

6. The device according to claim 1, characterized in that the first and second positioning means are arranged secured to the support, on each side of the receiving location in a horizontal direction (X), perpendicular to the vertical direction (Y).

7. The device according to claim 1, characterized in that the at least one first, and the at least one second positioning means, comprise at least two first positioning means, and at least two second positioning means, being arranged on each side of the receiving location in a horizontal direction (Y), perpendicular to the vertical direction (Z).

8. The device according to claim 1, characterized in that the receiving location is at least partially perforated, so as to allow access to the wafer (W) which is arranged therein, on the side of each base.

9. The device according to claim 1, characterized in that it comprises a platform for moving the support with respect to the bases, producing a translation of said support in a first and a second horizontal directions (X,Y), perpendicular to one another and to the vertical direction (Z).

10. The device according to claim 9, characterized in that the support is fixed to the displacement module by means of a first and a second sliding links in said first horizontal direction (X), substantially parallel to one another, arranged on each side of the support, the first sliding link being rigid, and the second sliding link being flexible.

11. The device according to claim 9, characterized in that, in the second horizontal direction (Y), the support is fixed to the displacement module by means of a flexible sliding link.

12. The device according to claim 9, characterized in that the support is fixed to the displacement module along one of its rims, or one of its edges, only.

13. The device according to claim 9, characterized in that the displacement module is firmly fixed to one of the bases.

14. Inspection equipment, in particular optical, for an integrated circuit wafer (W), comprising:
   a positioning device according to claim 1, and
   for at least one base, at least one sensor secured to said base.

* * * * *